(12) United States Patent
Ishimoto et al.

(10) Patent No.: US 12,322,613 B2
(45) Date of Patent: Jun. 3, 2025

(54) PRESSURE HEATING APPARATUS

(71) Applicant: SAMSUNG ELECTRONICS CO., LTD., Suwon-si (KR)

(72) Inventors: Tatsuya Ishimoto, Kanagawa (JP); Akihiro Komatsu, Tokyo (JP); Takahiro Tokumiya, Kanagawa (JP); Joongha Lee, Suwon-si (KR); Youngbum Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 693 days.

(21) Appl. No.: 16/987,042

(22) Filed: Aug. 6, 2020

(65) Prior Publication Data

US 2021/0043478 A1 Feb. 11, 2021

(30) Foreign Application Priority Data

Aug. 7, 2019 (JP) .................................. 2019-145415
Jun. 12, 2020 (KR) ........................ 10-2020-0071858

(51) Int. Cl.
  *H01L 21/67* (2006.01)
  *H01L 21/324* (2006.01)
  *H01L 21/687* (2006.01)

(52) U.S. Cl.
  CPC ...... *H01L 21/67115* (2013.01); *H01L 21/324* (2013.01); *H01L 21/67248* (2013.01); *H01L 21/68785* (2013.01)

(58) Field of Classification Search
  None
  See application file for complete search history.

(56) References Cited

U.S. PATENT DOCUMENTS

| 7,068,926 B2 * | 6/2006 | Nozaki ............. H01L 21/67115 118/724 |
| 7,184,657 B1 | 2/2007 | Camm et al. |
| 8,067,835 B2 | 11/2011 | Kida |
| 8,815,400 B2 | 8/2014 | Kanamaru et al. |

(Continued)

FOREIGN PATENT DOCUMENTS

| JP | H08139047 A2 | 5/1996 |
| JP | H0750264 | 11/2007 |

(Continued)

OTHER PUBLICATIONS

Ling Xei, et al. "High-Throughput Thermal Compression Bonding of 20 um Pitch Cu Pillar with Gas Pressure Bonder for 3D IC Stacking," 2016 IEEE 66th Electronics Components and Technology Conference, pp. 108-114, May 31, 2016.

(Continued)

*Primary Examiner* — Thien S Tran
(74) *Attorney, Agent, or Firm* — MORGAN, LEWIS & BOCKIUS LLP

(57) ABSTRACT

A pressure heating apparatus that uniformly heats an object in a chamber in a short time includes a stage onto which the object is loaded; a heating light source that faces the stage, where the heating light source heats the object a non-contact manner while irradiating light onto the object; and a lower reflector disposed around the stage and that reflects light emitted from the heating light source toward the object.

17 Claims, 8 Drawing Sheets

(56) References Cited

U.S. PATENT DOCUMENTS

| | | | | |
|---|---|---|---|---|
| 2003/0068903 | A1* | 4/2003 | Suzuki | H01L 21/67115 |
| | | | | 438/799 |
| 2005/0047767 | A1* | 3/2005 | Nozaki | F27D 5/0037 |
| | | | | 219/390 |
| 2006/0249695 | A1* | 11/2006 | Choi | H01L 21/67115 |
| | | | | 250/492.1 |
| 2006/0286807 | A1* | 12/2006 | Hwang | H01L 21/67115 |
| | | | | 216/60 |
| 2009/0298300 | A1 | 12/2009 | Ranish et al. | |
| 2013/0055952 | A1* | 3/2013 | Subramani | H01L 21/68735 |
| | | | | 118/725 |
| 2014/0158674 | A1* | 6/2014 | Moffatt | B23K 26/126 |
| | | | | 219/385 |
| 2017/0178979 | A1* | 6/2017 | Furukawa | H05B 1/0233 |
| 2017/0191897 | A1* | 7/2017 | Mueller | G01M 3/20 |
| 2017/0194163 | A1* | 7/2017 | Cosceev | H01L 21/2686 |
| 2017/0194175 | A1* | 7/2017 | Janisch | H01L 21/67115 |
| 2017/0194177 | A1* | 7/2017 | Cibere | H01L 21/324 |
| 2017/0194178 | A1* | 7/2017 | Cibere | G01R 31/2831 |
| 2017/0196046 | A1* | 7/2017 | Bremensdorfer | ............ |
| | | | | H01L 21/67115 |
| 2017/0243771 | A1* | 8/2017 | Abe | H01L 21/67115 |
| 2019/0304812 | A1* | 10/2019 | Lin | H01L 21/67103 |
| 2019/0311923 | A1* | 10/2019 | Kim | H01L 21/6708 |
| 2020/0045776 | A1* | 2/2020 | Huang | H01L 21/67017 |

FOREIGN PATENT DOCUMENTS

| | | |
|---|---|---|
| JP | 2009-130269 A2 | 6/2009 |
| JP | 2011508706 | 3/2011 |
| JP | 2011-211156 A2 | 10/2011 |
| JP | 2012119358 | 6/2012 |
| JP | 5278457 | 9/2013 |
| JP | 2015173264 | 10/2016 |
| KR | 10-2002-0028824 A | 4/2002 |
| KR | 10-2018-0068289 A1 | 6/2018 |
| KR | 20220007520 A * | 1/2022 |
| KR | 20220058775 A * | 10/2022 |

OTHER PUBLICATIONS

Office Action dated Oct. 21, 2024, is corresponding Koran Patent Application No. 10-2020-0071858, 2 pages.

Office Action dated Jun. 19, 2023 in corresponding Japanese Patent Application No. 2019-145415, 3 pages.

Notice of Allowance dated Mar. 26, 2025 issued in corresponding Korean Patent Application No. 10-2020-0071858. (Note: U.S. Pat. No. 7,184,657 B1 and KR 10-2002-0028824 A cited in previous IDS.).

* cited by examiner (A)

(B)

(A)

(B)

(C)

PRESSURE HEATING APPARATUS

CROSS-REFERENCE TO RELATED APPLICATIONS

This application claims priority under 35 U.S.C. § 119 from, and the benefit of Japanese Patent Application No. 2019-145415, filed on Aug. 7, 2019 in the Japanese Patent Office, and Korean Patent Application No. 10-2020-0071858, filed on Jun. 12, 2020 in the Korean Intellectual Property Office, the contents of both of which are herein incorporated by reference in their entireties.

BACKGROUND

Embodiments of the inventive concept are directed to a pressure heating apparatus.

For example, in a semiconductor chip mounting processes according to the related art, bonding is performed by reflow after chips are mounted, and after bonding, gaps between the chips are filled with encapsulants. In addition, in recent semiconductor chip mounting processes, because chips are 3-dimensionally stacked by using through-silicon via (TSV) techniques and bumps are reduced in size, gaps between the chips are also smaller. For this reason, it is challenging to fill encapsulants according to underfill after bonding set forth above.

Therefore, methods of bonding encapsulants in the form of films, such as non-conductive films (NCFs), at a wafer level in advance have been developed. When NCFs are used, thermal compression bonding (TCB) methods are generally used, in which chips are positioned on a wafer one by one, and encapsulants are cured and soldered by pressure heat treatments.

However, in these semiconductor chip mounting processes, because chips are bonded one by one, the productivity may deteriorate. For this reason, in recent semiconductor chip mounting processes, positioning, referred to as pre-bonding, of chips is performed as a different process from the above-described processes of curing of encapsulants and soldering, referred to as post-bonding, thereby improving productivity.

In addition, batch bonding processes have been proposed that suppress thermal expansion of encapsulants and implement uniform bonding and accurate positioning by performing reflow processes under pressurized atmospheres.

However, in these processes, encapsulant materials are liquids, and bit grinding processes are used to planarize the encapsulants that have been applied onto the wafers. In addition, additional processes are needed, to remove, clean and cut the chips generated due to the grinding processes, and to remove oxide layers from the bumps.

In pressure heating apparatuses that perform pressurization and heating as described above, to collectively perform pressurization and heating on a wafer, the in-plane temperatures of the wafer should be uniform and the wafer should be heated to a certain temperature in a short time.

However, in pressure heating apparatuses according to the related art, when a wafer is rapidly heated, the in-plane temperatures of the wafer become non-uniform due to differences in temperature between a central region and an outer region of the wafer.

SUMMARY

Embodiments of the inventive concept provide a pressure heating apparatus that can uniformly heat an object in a short time.

According to an embodiment of the inventive concept, there is provided a pressure heating apparatus that pressurizes and heats an object in a chamber, where the pressure heating apparatus includes: a stage onto which the object is loaded; a heating light source that faces the stage, where the heating light source heats the object in a non-contact manner while irradiating light onto the object; and a lower reflector disposed around the stage, where the lower reflector reflects light emitted from the heating light source toward the object.

In some embodiments, the lower reflector includes a hole that has a circular shape from a viewpoint of a plane that corresponds to the stage; and a reflective surface that surrounds the hole. In some embodiments, the reflective surface of the lower reflector includes a plurality of reflective surfaces, and the plurality of reflective surfaces are obliquely tilted relative to the stage, with each pair of adjacent surfaces meeting at a boundary line. In some embodiments, the reflective surface has a truncated cone shape that surrounds the hole.

In some embodiments, the heating light source includes a halogen lamp disposed inside the chamber, and the pressure heating apparatus further includes an upper reflector located on a side opposite to a stage-facing side of the heating light source, where the upper reflector reflects light emitted from the heating light source toward the object.

In some embodiments, the heating light source includes a laser light source located outside the chamber, and the pressure heating apparatus further includes a beam expander that converts laser light emitted from the laser light source into light irradiated onto the object. Here, a window that transmits light irradiated onto the object is formed in the chamber.

In some embodiments, the pressure heating apparatus further includes a shutter device located between the stage and the heating light source and that switches between irradiating and blocking light to the object.

In some embodiments, the heating light source includes a plurality of light-emitting devices arranged side by side in a plane facing the stage. Here, the plane facing the stage is divided into a plurality of regions to control light irradiated onto the object for each light-emitting device arranged in each region.

In some embodiments, the pressure heating apparatus further includes a pressure regulator that adjusts pressure in the chamber.

According to another embodiment of the inventive concept, there is provided a pressure heating apparatus that pressurizes and heats an object in a chamber, where the pressure heating apparatus includes: a stage onto which the object is loaded; a heating light source that faces the stage, where the heating light source heats the object in a non-contact manner while irradiating light onto the object; and an upper reflector that faces the stage with the heating light source located therebetween, where the upper reflector reflects light emitted from the heating light source toward the object.

In some embodiments, the upper reflector includes a first portion substantially parallel to the stage; and a second portion tilted relative to the first portion, wherein a degree of tilt of the second portion is adjusted such that light emitted from the heating light source is reflected by the second portion and then directed to the stage.

In some embodiments, pressure heating apparatus further includes a lower reflector disposed around the stage, where the lower reflector reflects light emitted from the heating light source toward the object or the upper reflector In some embodiments, the lower reflector reflects at least a portion of the light emitted from the heating light source toward the upper reflector.

According to another embodiment of the inventive concept, there is provided a pressure heating apparatus, where the pressure heating apparatus includes a heating light source that heats an object in a non-contact manner while irradiating light onto the object; an upper reflector that faces the heating light source and reflects light emitted from the heating light source toward the object; and a lower reflector that faces the heating light source and the upper reflector and that reflects light emitted from the heating light source toward the object or the upper reflector.

In some embodiments, the pressure heating apparatus further includes a stage onto which the object is loaded, where the stage is disposed on a side of the heating light source that is opposite from the upper reflector, and the lower reflector is disposed around the stage.

In some embodiments, the pressure heating apparatus further includes a shutter device that is located between the stage and the heating light source and switches between irradiating and blocking light to the object.

In some embodiments, the upper reflector includes a first portion substantially parallel to plane of the heating light sources, and a second portion tilted relative to the first portion, wherein a degree of tilt of the second portion is adjusted such that light emitted from the heating light source is reflected by the second portion and then directed to the object.

In some embodiments, the lower reflector includes a hole having a circular shape in a plan view; and a reflective surface that surrounds the hole. The reflective surface has a truncated cone shape that surrounds the hole.

In some embodiments, the lower reflector has a regular polygonal shape in a plan view, and the lower reflector includes a hole in a central region thereof; a first reflective surface that surrounds the hole and has a circular or regular polygonal shape in a plan view, and a plurality of second reflective surfaces that extend upward from an edge of the first reflective surface.

In some embodiments, the lower reflector has a regular polygonal shape in a plan view, and the lower reflector comprises a hole in a central region thereof, and a reflective surface that surrounds the hole and has a regular polygonal shape in a plan view.

BRIEF DESCRIPTION OF THE DRAWINGS

FIG. 4(A) is a plan view of the lower reflector, and FIG. 4(B) is a cross-sectional view of the lower reflector, taken along a line X-X of FIG. 4(A).

DETAILED DESCRIPTION OF EXEMPLARY EMBODIMENTS

Hereinafter, exemplary embodiments of the inventive concept will be described in detail with reference to the accompanying drawings.

A pressure heating apparatus 1A according to an embodiment of the inventive concept shown in FIGS. 1 to 5 will be described.

Figure 1:
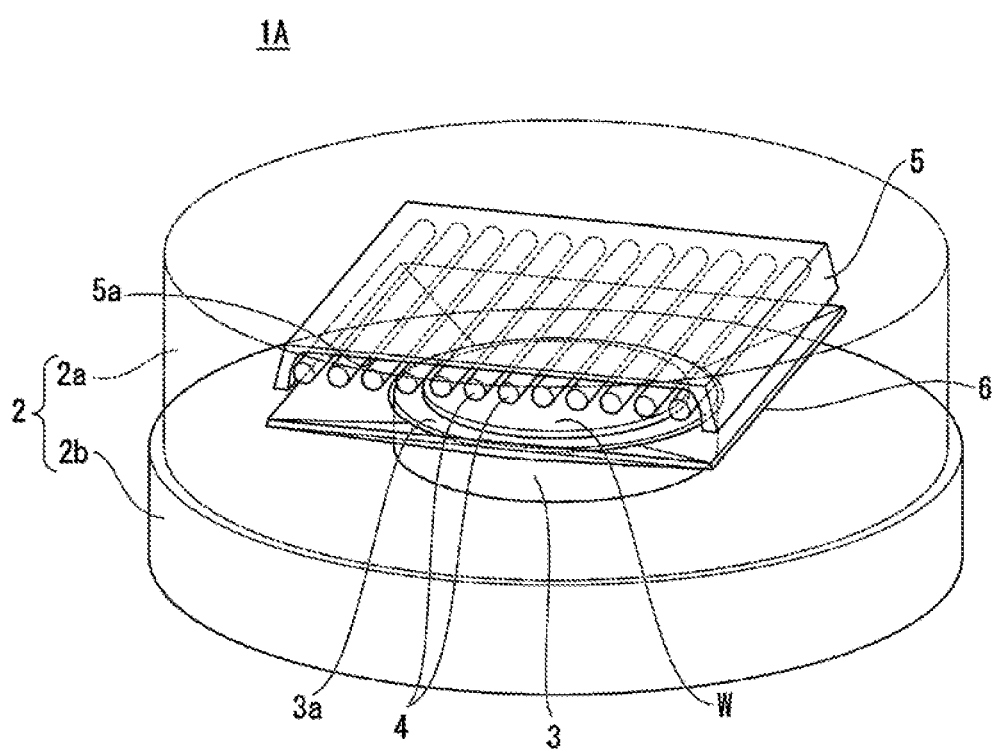
FIG. 1 is a perspective view of a pressure heating apparatus according to an embodiment of the inventive concept.
Figure 2:
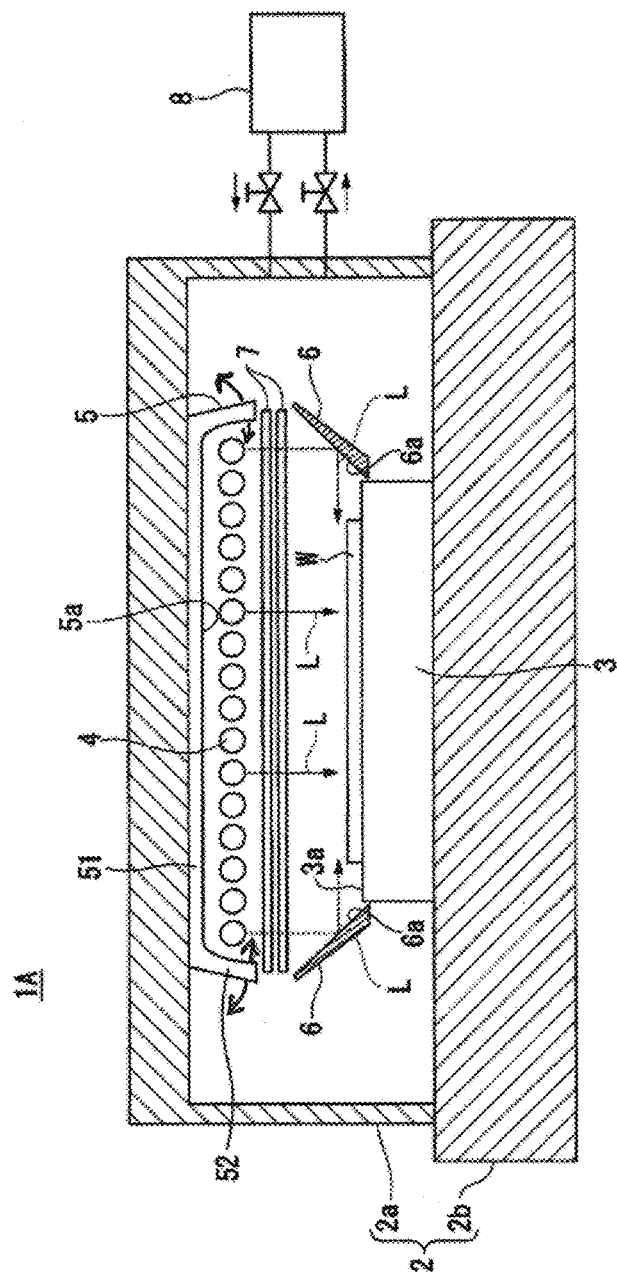
FIG. 2 is a cross-sectional view of a pressure heating apparatus shown in FIG. 1.
Figure 3:
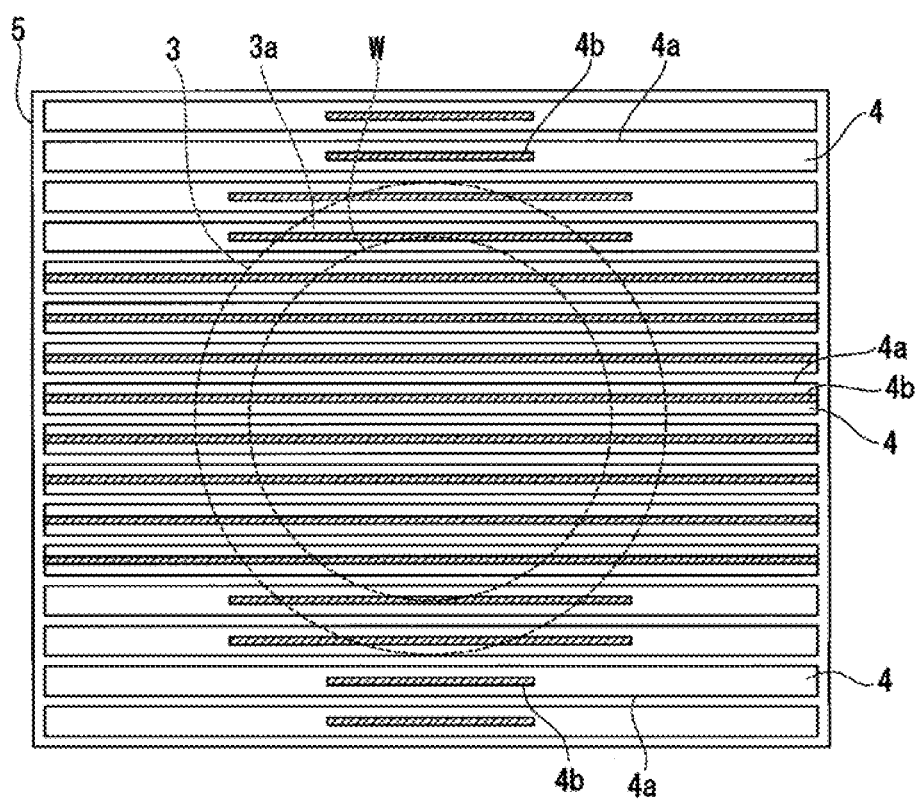
FIG. 3 is a plan view of a halogen lamp included in a pressure heating apparatus shown in FIG. 1.
Figure 4:
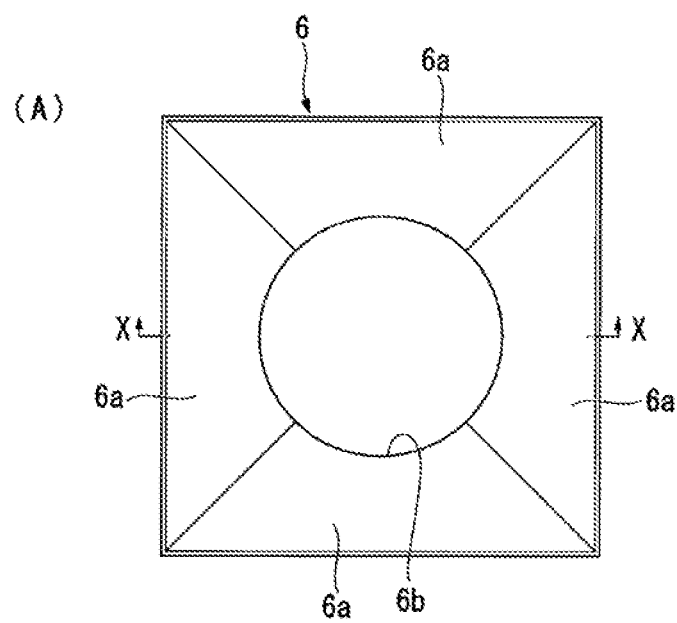
FIG. 4 illustrates a lower reflector included in a pressure heating apparatus shown in FIG. 1, and in particular.
Figure 4:
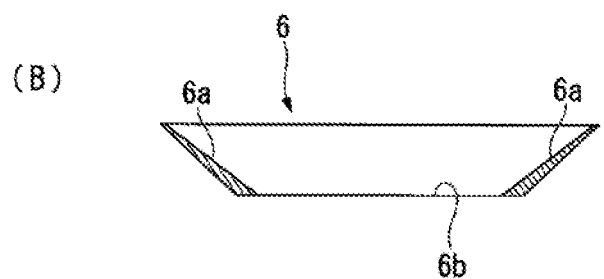
Figure 5:
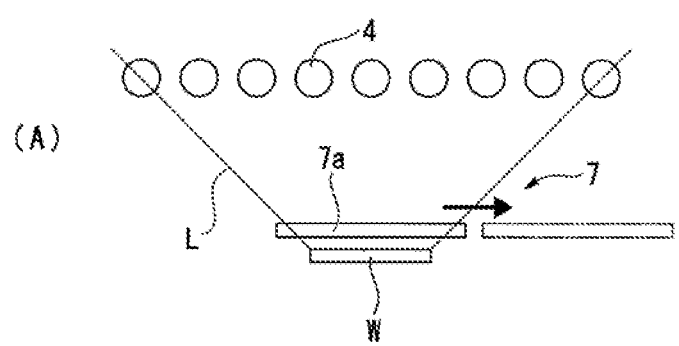
FIG. 5(A)-5(C) are cross-sectional views that illustrate a method of opening and shutting a shutter device included in a pressure heating apparatus shown in FIG. 1.
Figure 5:
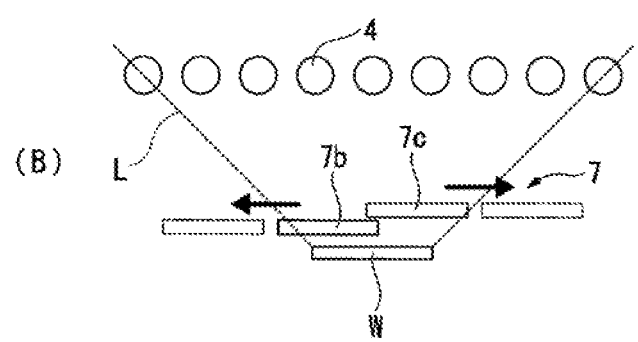
Figure 5:
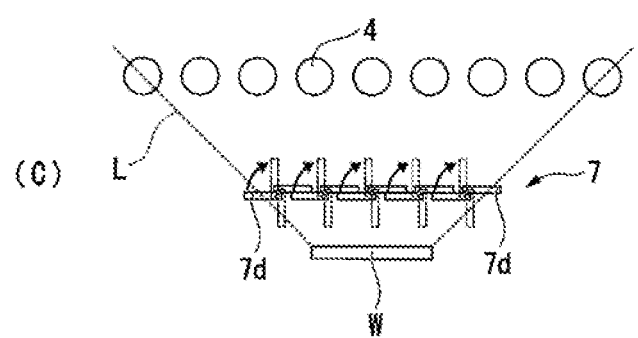

FIG. 1 is a perspective view of the pressure heating apparatus 1A. FIG. 2 is a cross-sectional view of the pressure heating apparatus 1A. FIG. 3 is a plan view of a halogen lamp 4 included in the pressure heating apparatus 1A. FIG. 4 illustrates a a lower reflector 6 included in the pressure heating apparatus 1A, and in particular, FIG. 4(A) is a plan view of the lower reflector 6, and FIG. 4(B) is a cross-sectional view of the lower reflector 6, taken along a line X-X of FIG. 4(A). FIG. 5 shows cross-sectional views that illustrate examples of a method of opening and shutting a shutter device 7 included in the pressure heating apparatus 1A.

As shown in FIGS. 1 and 2, the pressure heating apparatus 1A according to a present embodiment pressurizes and heats an object to be heated W in a chamber 2, and in outline, the pressure heating apparatus 1A includes a stage 3, a plurality of halogen lamps 4, an upper reflector 5, a lower reflector 6, a shutter device 7, and a pressure regulator 8. In addition, in FIG. 1, the shutter device 7 and the pressure regulator 8 are omitted for clarity of illustration.

According to an embodiment, the chamber 2 is a pressure-resistant container that can be divided into an upper container 2a and a lower container 2b, and the upper container 2a can be open and shut in a vertical direction relative to the lower container 2b, for example, by an opening-and-shutting mechanism such as a clutch.

According to an embodiment, the stage 3 has a loading surface 3a onto which the object to be heated W is loaded, and is located on a central portion of a surface of the lower container 2b. For example, the stage 3 includes a wafer holding mechanism, which is referred to as a susceptor, that includes an electrostatic chuck that holds a wafer, that is, the object to be heated W, that has been loaded onto the loading surface 3a.

According to an embodiment, the plurality of halogen lamps 4 are positioned to face the loading surface 3a of the stage 3 and are a heating light source that heats the object to be heated W (hereinafter referred to as object W) in a non-contact manner while irradiating infrared light L onto the object W after the object W has been loaded onto the loading surface 3a of the stage 3. As shown in FIGS. 1 to 3, each of the plurality of halogen lamps 4 includes a tungsten filament 4b in a long quartz glass tube 4a that emits infrared light, and the plurality of halogen lamps 4 are arranged parallel to each other on a lower-surface of the upper container 2a.

In addition, according to an embodiment, in each of the plurality of halogen lamps 4, the length of the tungsten filament 4b is adjusted in accordance with the shape of the loading surface 3a of the stage 3, which has a circular shape in a plan view. That is, the tungsten filaments 4a of the halogen lamps 4 arranged in a central region are relatively longer, and the tungsten filaments 4a of the halogen lamps 4 arranged on both sides relative to the central region have lengths that gradually decrease with increasing distance from the central region, so that each of the tungsten filaments 4a of the plurality of halogen lamps 4 has an optimal length. Accordingly, infrared light L can be efficiently irradiated from the plurality of halogen lamps 4 toward the object W loaded on the loading surface 3a of the stage 3. Although the halogen lamps 4 are illustrated here as an example of a heating light source, embodiments are not limited thereto, it will be understood by those of ordinary skill in the art that in other embodiments, various other heating light sources may be used.

As shown in FIGS. 1 and 2, according to an embodiment, the upper reflector 5 has a reflective surface 5a that faces the plurality of halogen lamps 4 and covers a side of the plurality of halogen lamps 4 opposite to a stage 3-facing side of the plurality of halogen lamps 4. Accordingly, the upper reflector 5 reflects infrared light L that has been emitted toward the upper container 2a from the plurality of halogen lamps 4 back toward the object W on the loading surface 3a of the stage 3.

In addition, according to an embodiment, the upper reflector 5 is shaped to concentrate light from the reflective surface 5a onto the object W. Accordingly, the upper reflector 5 reflects and concentrates infrared light L that has been irradiated toward the reflective surface 5a and efficiently irradiates the infrared light L back toward the object W on the loading surface 3a of the stage 3.

Specifically, according to an embodiment, the upper reflector 5 includes a first portion 51, which extends substantially parallel to the stage 3 or a plane of the heating light sources 4, and a second portion 52, which is tilted downward toward the stage 3 relative to the first portion 51. A degree of tilt of the second portion 52 can be adjusted such that at least a portion of light emitted from the halogen lamps 4 is reflected to the stage 3 by the second portion 52.

In some embodiments, an inner surface of the second portion 52, that is, a surface of the second portion 52 that faces the halogen lamps 4 at least partially includes a curved surface. The dimensions of the curved surface, such as a radius of curvature, etc., are determined such that light emitted from the halogen lamps 4 is more efficiently concentrated on the stage 3.

According to an embodiment, light reflected by the second portion 52 is light emitted from the halogen lamps 4 toward the second portion 52, or is light emitted from the halogen lamps 4 toward the stage 3 but was reflected by the lower reflector 6, to be described below, back toward the second portion 52.

According to an embodiment, as shown in FIGS. 1, 2, 4(A), and 4(B), the lower reflector 6 has a reflective surface 6a obliquely tilted upwards and that surrounds the stage 3. The lower reflector 6 has a rectangular shape, a square shape in this embodiment, in a plan view and includes a hole 6b formed in a central region thereof and four reflective surfaces 6a surrounding the hole 6b, the hole 6b having a circular shape from the viewpoint of a plane corresponding to the stage 3, i.e. in a plan view. The four reflective surfaces 6a are obliquely tilted upwards, with each pair of adjacent surfaces meeting at a boundary line.

Accordingly, in an embodiment, the lower reflector 6 reflects a portion of the infrared light L emitted from the plurality of halogen lamps 4 toward the outside of the stage 3 back toward the object W on the loading surface 3a of the stage 3, or toward the upper reflector 5.

In some embodiments, the reflective surfaces 6a of the lower reflector 6 reflect at least a portion of the infrared light L emitted from the halogen lamps 4 toward the upper reflector 5. In this case, the infrared light L reflected by the lower reflector 6 is reflected by the upper reflector 5 back toward the stage 3, so that the object W on the stage 3 can be more uniformly and rapidly heated.

As shown in FIG. 2, according to an embodiment, the shutter device 7 is located between the stage 3 and the plurality of halogen lamps 4. The shutter device 7, by opening and shutting a shutter thereof, switches between irradiating and blocking the infrared light L with respect to the object W on the loading surface 3a of the stage 3. Accordingly, the object W can be rapidly heated in a non-contact manner.

According to an embodiment, a method of opening and shutting the shutter device 7, as, for example, shown in FIG. 5(A), uses a method of in-plane sliding of one shutter plate 7a to switch between irradiating and blocking the infrared light L. In addition, as shown in FIG. 5(B), a method of respectively performing in-plane sliding of two shutter plates 7b and 7c in opposite directions to switch between irradiating and blocking the infrared light L may be used. Further, as shown in FIG. 5(C), a method of respectively rotating a plurality of shutters 7d around shafts to switch between irradiating and blocking the infrared light L may be used, where the plurality of shutters 7d are arranged side by side in an in-plane direction.

As shown in FIG. 2, according to an embodiment, the pressure regulator 8 adjusts pressure in the chamber 2 and is mounted to a side surface of the upper container 5a. The pressure regulator 8 can reduce the pressure in the chamber 2 by degassing the chamber 2 or increase the pressure in the chamber 2 by supplying nitrogen gas into the chamber 2.

According to an embodiment, the pressure heating apparatus 1A having the configuration described above can be used in, for example, a process of fabricating a 3-dimensional stack device using a through-silicon via (TSV) technique. Specifically, in a chip-on-wafer (CoW) method in which a plurality of chips are stacked and bonded onto the wafer and then the wafer is divided, the pressure heating apparatus 1A is used when curing of an encapsulant and soldering (post-bonding) are performed by collectively pressurizing and heating the wafer after the plurality of chips have been positioned (pre-bonded) to correspond to the object to be heated W.

In a post-bonding process using the pressure heating apparatus 1A according to a present embodiment, first, a wafer is loaded onto the loading surface 3a of the stage 3, and then, the chamber 2 is sealed. In addition, according to an embodiment, a stainless steel pressure-resistant container having 300° C. heat resistance and 1.5 MPa pressure resistance is used for the chamber 2.

Next, according to an embodiment, after the chamber 2 is degassed (depressurized), nitrogen gas is supplied into the chamber 2, and while preliminary heating is performed on the chamber 2, the chamber 2 is pressurized such that the pressure in the chamber 2 becomes 1.5 MPa.

Next, according to an embodiment, when the pressurization is completed, the wafer is rapidly heated to a temperature equal to or greater than 250° C., which is a solder melting point, at a rate of 200° C./sec. Here, as an encapsulant, a thermosetting resinused in a thermal compression bonding (TCB) method is used. In addition, the halogen lamp 4 has a peak wavelength of 900 nm that corresponds to an absorption wavelength of silicon (wafer) and can provide rapid temperature rise at a rate of 200° C./sec.

Next, according to an embodiment, a temperature in the chamber 2 is reduced. In addition, after reducing the temperature in the chamber 2 to 200° C. or less, the pressure in the chamber 2 is reduced. Further, after the pressure in the chamber 2 is reduced to atmospheric pressure and the temperature of the wafer is reduced to 80° C. or less, the pressure in the chamber 2 is further reduced, and then, air is introduced into the chamber 2. Accordingly, the wafer may be taken out by opening the chamber 2.

According to the pressure heating apparatus 1A of a present embodiment, by arranging the lower reflector 6 around the stage 3, a portion of the infrared light L emitted from the plurality of halogen lamps 4 toward the outside of the stage 3 can be redirected back toward the wafer inside the stage 3. Accordingly, in a post-bonding process using the pressure heating apparatus 1A according to a present embodiment, even when the wafer is rapidly heated, it has been confirmed that a temperature difference between a central region and an outer region of the wafer can be maintained to within ±5° C.

As described above, according to the pressure heating apparatus 1A of a present embodiment, the wafer to be heated W can be uniformly heated in a short time. In addition, in a post-bonding process that uses the pressure heating apparatus 1A according to a present embodiment, while the in-plane temperature of the wafer is maintained substantially constant, pressurizing and heating can be collectively performed on the wafer even without changing an encapsulant material. Therefore, a process time can be reduced.

Figure 6:
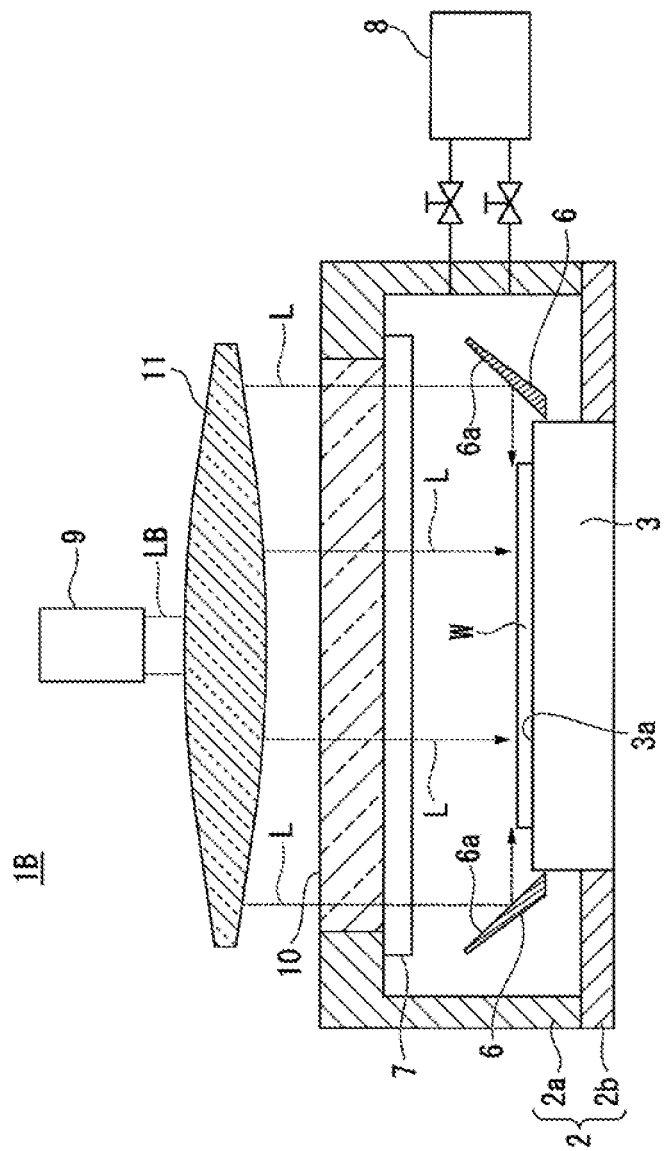
FIG. 6 is a cross-sectional view of a pressure heating apparatus according to a another embodiment of the inventive concept.

According to another embodiment of the inventive concept, a pressure heating apparatus 1B shown in FIG. 6 will be described. FIG. 6 is a cross-sectional view of the pressure heating apparatus 1B. In the following descriptions, descriptions of components or portions of the pressure heating apparatus 1B, which are equivalent to those of the pressure heating apparatus 1A, will be omitted, and like components may be denoted by like reference numerals.

As shown in FIG. 6, the pressure heating apparatus 1B according to a present embodiment includes, as a heating light source, a laser light source 9 that emits infrared laser light LB, instead the halogen lamps 4 and the upper reflector 5.

According to an embodiment, the laser light source 9 is located outside the chamber 2. Specifically, the laser light source 9 is positioned to face a top wall of the upper container 2a and emits infrared laser light LB toward the upper container 2a. The top wall of the upper container 2a includes a window 10 that transmits the infrared laser light LB being irradiated onto the object to be heated W. In addition, the laser light source 9 may include, for example, a YAG laser, a semiconductor laser, etc.

Further, the pressure heating apparatus 1B according to a present embodiment includes a beam expander 11 that converts the infrared laser light LB emitted from the laser light source 9 into the infrared light L that is irradiated onto the object W. The beam expander 11 is located between the laser light source 9 and the window 10 of chamber 2 and includes a plurality of lenses that expand and collimate the infrared laser light LB. Accordingly, the infrared laser light LB is converted into the infrared light L that is irradiated onto the object W, and the infrared light L is irradiated through the window 10 toward the object W on the loading surface 3a of the stage 3.

Like the pressure heating apparatus 1A, the pressure heating apparatus 1B of a present embodiment has the lower reflector 6 arranged around the stage 3, and a portion of the infrared light L that is incident through the window 10 and toward the outside of the stage 3 is redirected back toward the wafer inside the stage 3.

Accordingly, according to the pressure heating apparatus 1B of a present embodiment, the object W can be uniformly heated in a short time. In addition, in a post-bonding process that uses the pressure heating apparatus 1B according to a present embodiment, as in the case of using the pressure heating apparatus 1A, while the in-plane temperature of the wafer is maintained substantially constant, pressurizing and heating can be collectively performed on the wafer even without changing the encapsulant material. Therefore, a process time can be reduced.

Figure 7:
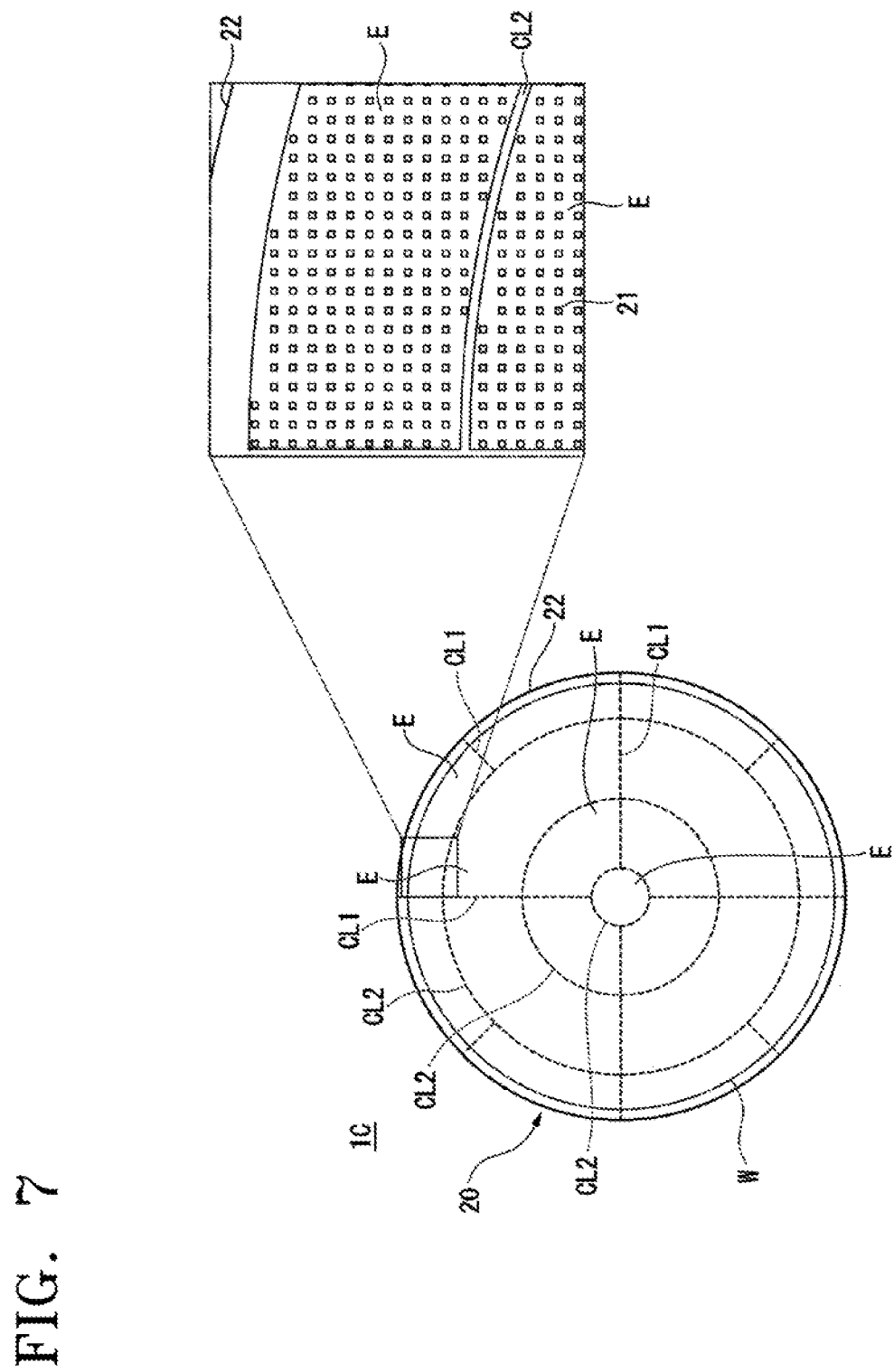
FIG. 7 is a plan view of a heating light source included in a pressure heating apparatus according to a still another embodiment of the inventive concept.

Next, according to another embodiment of the inventive concept, a heating light source included in a pressure heating apparatus 1C and shown in FIG. 7 will be described. FIG. 7 is a plan view of a heating light source 20 included in the pressure heating apparatus 1C. In the following descriptions, descriptions of components or portions of the pressure heating apparatus 1C that are equivalent to those of the pressure heating apparatus 1A will be omitted, and like components may be denoted by like reference numerals.

As shown in FIG. 7, the pressure heating apparatus 1C according to a present embodiment includes the heating light source 20 that emits infrared light L, instead of halogen lamps 4 and upper reflector 5. Except for these differences, the pressure heating apparatus 1C has basically the same configuration as that of the pressure heating apparatus 1A. Therefore, FIG. 7 illustrates only the heating light source 20.

According to an embodiment, the heating light source 20 includes a plurality of light-emitting devices 21, such as light-emitting diodes (LEDs) or vertical cavity surface emitting lasers (VCSELs), that emit infrared light L. The plurality of light-emitting devices 21 are mounted on a lower surface of a mounting substrate 22 that faces the stage 3.

According to an embodiment, the mounting substrate 22 has a circular plate shape that is slightly larger than a wafer, which is marked by a dash-double dotted line in FIG. 7, on the loading surface 3a of the stage 3. The plurality of light-emitting devices 21 are arranged side by side in a matrix form in a surface of the mounting substrate 22, the surface facing the stage 3.

According to an embodiment, the stage 3-facing surface of the mounting substrate 22 is divided into a plurality of regions E, and the heating light source 20 controls light irradiated onto the object W on the basis of the light emitting devices 21 located in each region E. Specifically, the mounting substrate 22 has a structure in which the stage 3-facing surface thereof is divided into the plurality of regions E according to division lines CL1 that radially divide the stage 3-facing surface and division lines CL2 that concentrically divide the stage 3-facing surface.

According to the pressure heating apparatus 1C of a present embodiment, the infrared light L irradiated toward the object W is controlled for each light-emitting device 21 in each region E of the mounting substrate 22. Therefore, the in-plane temperature of the wafer, which is the object W, can be controlled in more detail.

In addition, according to an embodiment, in the heating light source 20, by changing a peak wavelength of the infrared light L emitted from the plurality of light-emitting devices 21, the object W can be efficiently heated by using the light-emitting devices 21 at a peak wavelength, at which the object W has high absorbance.

Further, according to the pressure heating apparatus 1C of a present embodiment, like the pressure heating apparatus 1A, by arranging the lower reflector 6 around the stage 3, a portion of the infrared light L emitted from the heating light source 20 toward the outside of the stage 3 can be redirected back toward the wafer, that is, the object W, inside the stage 3.

Accordingly, according to the pressure heating apparatus 1C of a present embodiment, the object W can be uniformly heated in a short time. In addition, in a post-bonding process that uses the pressure heating apparatus 1C according to a present embodiment, as in the case of using the pressure heating apparatus 1A, while the in-plane temperature of the wafer is maintained substantially constant, pressurizing and heating can be collectively performed on the wafer even without changing the encapsulant material. Therefore, a process time can be reduced.

In addition, embodiments of the inventive concept are not limited to exemplary embodiments described above, and it should be understood that various modifications and changes may be made without departing from the spirit and scope of the inventive concept.

Figure 8:
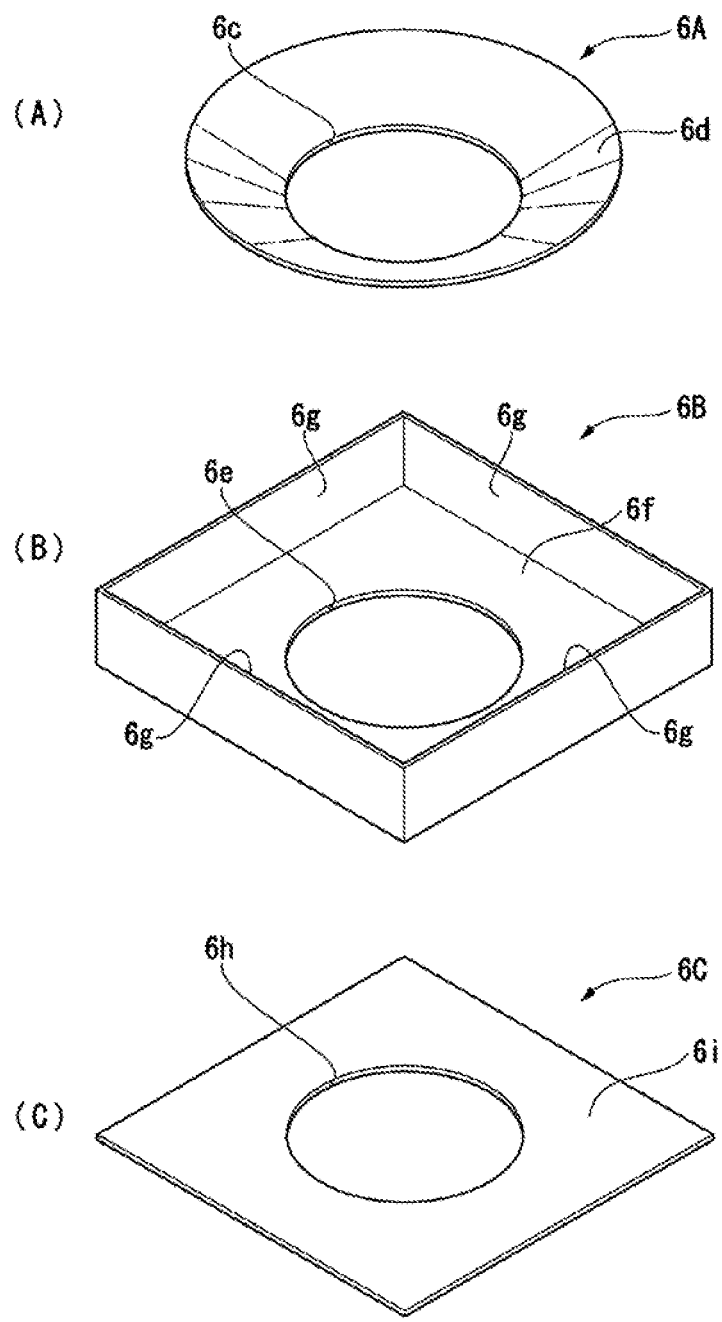
FIG. 8(A)-8(C) shows perspective views of examples of a lower reflector.

Specifically, according to embodiments, the lower reflector 6 is not limited to the shape thereof shown in FIG. 4, and in other embodiments, for example, the lower reflector 6 may have shapes 6A to 6C respectively shown in FIGS. 8(A) to 8(C). FIGS. 8(A) to 8(C) are perspective views that illustrates the lower reflectors 6A to 6C, respectively.

According to an embodiment, the lower reflector 6A of FIG. 8(A) has a circular shape in a plan view and includes a hole 6c in a central region thereof and a reflective surface 6d having a truncated cone shape that surrounds the hole 6c, the hole 6c having a circular shape from the viewpoint of a plane corresponding to the stage 3, or a plan view.

According to an embodiment, the lower reflector 6B of FIG. 8(B) has a regular polygonal shape, a square shape in this embodiment, in a plan view, and the lower reflector 6B includes: a hole 6e in a central region thereof that has a circular shape from the viewpoint of a plane corresponding to the stage 3, or a plan view; a first reflective surface 6f that surrounds the hole 6e and has a circular or regular polygonal shape in a plan view; and a plurality of second reflective surfaces 6g that extend upward from an edge of the first reflective surface 6e. In the embodiment shown in FIG. 8B, the first reflective surface 6f has a square shape and there are four second reflective surfaces 6g.

According to an embodiment, the lower reflector 6C of FIG. 8(C) has a circular shape or a regular polygonal shape in a plan view, and the lower reflector 6C includes: a hole 6h in a central region thereof, the hole 6h having a circular shape from the viewpoint of a plane corresponding to the stage 3, or plan view; and a reflective surface 6i, which surrounds the hole 6h and has a circular or regular polygonal shape in a plan view. In the embodiment shown in FIG. 8C, the reflective surface 6i has a square shape.

According to embodiments, in each of the pressure heating apparatuses 1, 1A and 1B, instead of the lower reflector 6, these lower reflectors 6A to 6C may be used.

Embodiments of the inventive concept are not limited to being incorporated into a pressure heating apparatus, that cures an encapsulant and solders (post-bonding) by collectively pressurizing and heating a wafer, and embodiments of the inventive concept can be broadly used with pressure heating apparatuses that pressurize and heat an object in a chamber.

As described above, according to an embodiment of the inventive concept, a pressure heating apparatus that uniformly heats an object in a short time is provided.

While embodiments of the inventive concept has been particularly shown and described with reference to exemplary embodiments thereof, it will be understood that various changes in form and details may be made therein without departing from the spirit and scope of the following claims.

What is claimed is:

1. A pressure heating apparatus that pressurizes and heats an object in a chamber, the pressure heating apparatus comprising:
   a stage onto which the object is loaded;
   a heating light source that faces the stage, wherein the heating light source heats the object in a non-contact manner while irradiating light onto the object;
   a lower reflector disposed around the stage, wherein the lower reflector is tilted and extends away from the stage and the object, wherein the lower reflector reflects light emitted from the heating light source toward the object;
   an upper reflector located on a side opposite to a stage-facing side of the heating light source, wherein the upper reflector reflects light emitted from the heating light source toward the object; and
   a shutter plate located between the object and the heating light source, wherein the shutter plate slides in horizontal direction and switches between a first mode that irradiates light to the object and a second mode that blocks light to the object, wherein the object is located between the stage and the shutter plate,
   wherein the upper reflector comprises:
      a first portion substantially parallel to an upper surface of the stage; and
      a second portion tilted relative to the first portion,
      wherein a degree of tilt of the second portion is adjusted such that light emitted from the heating light source is reflected by the second portion and then directed to the object,
   wherein a reflective surface of the lower reflector reflects a first light of the light emitted from the heating light source toward the upper reflector, and
   wherein the degree of tilt of the second portion is adjusted such that the first light reflected by the lower reflector is reflected by the upper reflector back toward the object.

2. The pressure heating apparatus of claim 1, wherein the lower reflector comprises:
   a hole that has a circular shape from a viewpoint of a plane that corresponds to the stage; and
   the reflective surface that surrounds the hole.

3. The pressure heating apparatus of claim 2, wherein the reflective surface of the lower reflector comprises a plurality of reflective surfaces, and
   the plurality of reflective surfaces are obliquely tilted relative to the stage, with each pair of adjacent surfaces meeting at a boundary line.

4. The pressure heating apparatus of claim 2, wherein the reflective surface has a truncated cone shape that surrounds the hole.

5. The pressure heating apparatus of claim 1, wherein the heating light source comprises a halogen lamp disposed inside the chamber.

6. The pressure heating apparatus of claim 1, wherein the heating light source comprises a laser light source located outside the chamber,
   the pressure heating apparatus further comprises a beam expander that converts laser light emitted from the laser light source into light irradiated onto the object, and
   the chamber includes a window that transmits light irradiated onto the object.

7. The pressure heating apparatus of claim 1, wherein
the heating light source comprises a plurality of light-emitting devices arranged side by side in a plane facing the stage, and,
the plane facing the stage is divided into a plurality of regions that control light irradiated onto the object for each light-emitting device arranged in each region.

8. The pressure heating apparatus of claim 1, further comprising a pressure regulator that adjusts pressure in the chamber.

9. A pressure heating apparatus that pressurizes and heats an object in a chamber, the pressure heating apparatus comprising:
a stage onto which the object is loaded;
a heating light source that faces the stage, wherein the heating light source heats the object in a non-contact manner while irradiating light onto the object;
an upper reflector that faces the stage with the heating light source located therebetween, wherein the object is located between the stage and the heating light source, wherein the upper reflector reflects the light emitted from the heating light source toward the object to be heated; and
a shutter device is located between the stage and the heating light source, wherein the shutter device slides in a horizontal direction and switches between a first mode that irradiates light to the object and a second mode that blocks light to the object,
wherein the upper reflector comprises:
a first portion substantially parallel to the stage; and
a second portion tilted relative to the first portion,
wherein a degree of tilt of the second portion is adjusted such that light emitted from the heating light source is reflected by the second portion and then directed to the stage,
wherein a reflective surface of a lower reflector reflects a first light of the light emitted from the heating light source toward the upper reflector, and
wherein the degree of tilt of the second portion is adjusted such that the first light reflected by the lower reflector is reflected by the upper reflector back toward the stage.

10. The pressure heating apparatus of claim 9,
wherein the lower reflector disposed around the stage, wherein the lower reflector reflects light emitted from the heating light source toward the object or the upper reflector.

11. The pressure heating apparatus of claim 10, wherein the lower reflector reflects at least a portion of the light emitted from the heating light source toward the upper reflector.

12. A pressure heating apparatus, comprising:
a heating light source that heats an object in a non-contact manner while irradiating light onto the object;
an upper reflector that faces the heating light source and reflects light emitted from the heating light source toward the object; and
a lower reflector disposed around the object and that faces the heating light source and the upper reflector and that reflects the light emitted from the heating light source toward the object or the upper reflector, wherein the lower reflector is tilted and extends away from the object,
wherein the upper reflector comprises:
a first portion substantially parallel to plane of the heating light sources; and
a second portion tilted relative to the first portion,
wherein a degree of tilt of the second portion is adjusted such that light emitted from the heating light source is reflected by the second portion and then directed to the object,
wherein a reflective surface of the lower reflector reflects a first light of the light emitted from the heating light source toward the upper reflector, and
wherein the degree of tilt of the second portion is adjusted such that the first light reflected by the lower reflector is reflected by the upper reflector back toward the object.

13. The pressure heating apparatus of claim 12, further comprising
a stage onto which the object is loaded, wherein the stage is disposed on a side of the heating light source that is opposite from the upper reflector, and the lower reflector is disposed around the stage.

14. The pressure heating apparatus of claim 13, further comprising
a shutter device that is located between the stage and the heating light source and switches between irradiating and blocking light to the object.

15. The pressure heating apparatus of claim 12, wherein the lower reflector comprises:
a hole having a circular shape in a plan view; and
the reflective surface that surrounds the hole and is obliquely tilted with respect to the object.

16. The pressure heating apparatus of claim 12, wherein the lower reflector has a regular polygonal shape in a plan view,
the lower reflector comprises a hole in a central region thereof,
the reflective surface of the lower reflector comprises a first reflective surface that surrounds the hole and has a circular or regular polygonal shape in a plan view, and
a plurality of second reflective surfaces that extend upward from an edge of the first reflective surface.

17. The pressure heating apparatus of claim 12, wherein the lower reflector has a regular polygonal shape in a plan view, and
the lower reflector comprises
a hole in a central region thereof, and
the reflective surface that surrounds the hole and has a regular polygonal shape in a plan view.

* * * * *